US005691099A

United States Patent [19]

Kusakata et al.

[11] Patent Number: 5,691,099

[45] Date of Patent: Nov. 25, 1997

[54] THERMAL DEVELOPING TYPE DIAZO COPYING MATERIAL UTILIZING WATER SOLUBLE QUANIDINE SALT

[75] Inventors: Shigeru Kusakata, Susono; Masanori Rimoto, Mishima; Kazuo Matsuda, Numazu; Naohito Shimota, Shizuoka-ken, all of Japan

[73] Assignee: Ricoh Company, Ltd., Toyko, Japan

[21] Appl. No.: 529,674

[22] Filed: Sep. 18, 1995

[30] Foreign Application Priority Data

| | | | |
|---|---|---|---|
| Sep. 22, 1994 | [JP] | Japan | 6-254316 |
| Sep. 5, 1995 | [JP] | Japan | 7-251958 |

[51] Int. Cl.$^6$ .............................. G03F 7/021; G03C 5/18

[52] U.S. Cl. .......................... 430/162; 430/151; 430/157

[58] Field of Search .................................... 430/146, 151, 430/157, 158, 162

[56] References Cited

U.S. PATENT DOCUMENTS

| | | | |
|---|---|---|---|
| 4,411,979 | 10/1983 | Nagamoto et al. | 430/151 |
| 5,424,164 | 6/1995 | Satomura et al. | 430/151 |
| 5,556,733 | 9/1996 | Kusakata et al. | 430/162 |

FOREIGN PATENT DOCUMENTS

| | | |
|---|---|---|
| 57-42042 | 3/1982 | Japan . |
| 57-44141 | 3/1982 | Japan . |
| 57-45094 | 3/1982 | Japan . |
| 57-125091 | 8/1982 | Japan . |
| 57-142391 | 9/1982 | Japan . |
| 57-199684 | 12/1982 | Japan . |
| 57-199685 | 12/1982 | Japan . |
| 59-190886 | 10/1984 | Japan . |

*Primary Examiner*—Christopher G. Young
*Attorney, Agent, or Firm*—Cooper & Dunham LLP

[57] ABSTRACT

The object of the present invention is to provide a novel and useful thermal developing type diazo copying material wherein an initial image quality and an initial image reliability are maintained, while undesired coloring can be avoided and long-term preservation characteristics can be improved. The present invention comprises a support, a photosensitive layer formed on said support, said photosensitive layer including a diazo compound, and a coupler layer formed on said support, said coupler layer including a coupler component, said coupler layer having a copolymer including a monomer having a carboxylic acid and water-soluble guanidine salt.

6 Claims, No Drawings

THERMAL DEVELOPING TYPE DIAZO COPYING MATERIAL UTILIZING WATER SOLUBLE QUANIDINE SALT

BACKGROUND OF THE INVENTION

1.Field of the Invention

The present invention generally relates to a thermal developing type diazo copying material, .and more particularly to a thermal developing type diazo copying material which is overlapped with a transparent or non-transparent material, and exposed to form a latent image, the latent image being developed by heating.

2.Description of the Related Art

Generally, a thermal developing type diazo copying material includes a support such as a paper or a film and a photosensitive layer including a diazo compound, a coupling component and a developing agent. As the developing agent, urea or trichloroacetic acid is usually used. This type of diazo copying material is developed by applying a heat of 180° C.–200° C. The development mechanism is based on alkali generated by a thermal degradation. In order to reduce a development temperature, a thermal melting material such as high fatty acid amide is used as the developing agent. In this case, the development mechanism is based on an activation of a diazo compound and a coupling element by thermal melting.

However, in the conventional thermal developing type diazo copying material, an undesirable color reaction sometimes occurs due to the precoupling of the elements during a preservation.

Japanese Laid-Open Patent Applications Nos. 57-42042, 57-45094 and 57-125091 disclose that at least one of the diazo compound, the coupling component and an alkali generator is prepared in a non-continuous particle form so that a contact between the above components are prevented and the undesirable precoupling can be avoided. However, in this case, preservation characteristics are not adequate.

Japanese Laid-Open Patent Applications Nos. 57-44141 and 59-190886 disclose that one of the diazo compound, the coupling component and the alkali generator is contained in capsules to isolate one from the others. However, these methods do not provide the satisfactory preservation characteristics and adequate thermal-coloring characteristics.

Japanese Laid-Open Patent Application No. 57-142391 discloses that the diazo compound and the coupling component are contained in different layers which are separated by an intermediate resin layer including a thermal melting material. However, the intermediate layer is not adequate enough to separate the diazo compound and the coupling component.

Japanese Patent Publication No. 4-3315 discloses a usage of a binder material which is soluble in the developing liquid containing a base and is insoluble under an acidic condition. However, since the base exists in the binder material, the binder can not be adequately insoluble and the undesirable precoupling during the preservation cannot be avoided.

SUMMARY OF THE INVENTION

Accordingly, it is a general object of the present invention to provide a novel and useful thermal developing type diazo copying material in which an initial image quality and an initial image reliability are maintained, while the undesired coloring can be avoided and long-term preservation characteristics can be improved.

The above object of the present invention is achieved by a thermal developing type diazo copying material comprising a support, a photosensitive layer formed on the support, the photosensitive layer including a diazo compound, and a coupler layer formed on the support, the coupler layer including a coupler component, the coupler layer having a copolymer resin including a monomer having a carboxylic acid and water-soluble guanidine salt.

In the above invention, at least one of the coupler layer and the photosensitive layer may include a thermal melting material having a melting point ranging from 60° C. to 150° C.

The above invention may further comprise a intermediate layer provided between the coupler layer and the photosensitive layer, the intermediate layer including a copolymer including a monomer having one of carboxylic acid and/or a thermal melting material having a melting point ranging from 60° C. to 150° C.

In the above invention, the copolymer resin may be styrene-acrylic acid copolymer.

In the above invention, the copolymer resin may be styrene-acrylic acid copolymer having a Tg more than 60° C.

In the above invention, the copolymer resin may be a mixture of styrene-acrylic acid copolymer and isobutylene-maleic anhydride or a mixture of styrene-acrylic acid copolymer and styrene-maleic arthydride copolymer.

In the conventional thermal developing type diazo copying materials, each of the diazo compound and the coupling element is contained in different layers or at least one of them is coated by resin forming covering layers.

We have found that when a copolymer or preferably an ammonia salt thereof comprising a monomer having carboxylic acid is used in the coupler layer liquid, this resin forms a water-insoluble layer which prevents the coupler component from contacting the diazo compound. We have also found that if to this layer is added a basic material such as an inorganic alkali and an organic amine as a coloring promoter, a formation of the water-soluble layer is not adequate and the undesirable coloring occurs during the preservation. On the other hand, when a weak base such as urea is used, the undesirable coloring seldom occurs, but the color appearing is not strong enough. Based on the following research, we have found that when a water-soluble guanidine salt is used as the coloring promoter, the color strength is maintained and the undesirable coloring does not occur.

As the copolymer resin used in the present invention, styrene-acrylic acid copolymer, styrene-maleic anhydride copolymer, and isobutylene-maleic anhydride copolymer can be listed. However, styrene-acrylic acid copolymer having a Tg more than 60° C. is most preferred in view of the preservation characteristics. Also, a mixture of styrene-acrylic acid copolymer and styrene-maleic anhydride copolymer or a mixture of styrene-acrylic acid copolymer and isobutylene-maleic anhydride copolymer are preferred.

When the resin mixture is used, the undesirable precoupling can be prevented during the preservation, the undesirable coloring can be decreased and the color strength is maintained, compared to the single resin. The reason for that is not clear. It is known that a mixture of the solution of an ammonia salt of styrene-acrylic acid copolymer and a solution of an ammonia salt of isobutylene-maleic anhydride is transparent when it is weak and is a white gel when it is strong. When the resin mixture solution in which the coupling component is dispersed is applied to a support and the resin mixture is dried, a gelation of the resin mixture solution is promoted and a stiff coating of the coupler component can be formed with an evaporation of ammonia and water. As for a mixing ratio, 1 part of styrene-acrylic acid copolymer is mixed with 0.01–2.0 parts, more preferably 0.1–1.0 parts of isobutylene-malate anhydride or styrene-malate anhydride based on weight.

The above copolymer resin is usually prepared in a form of an ammonia salt by dissolving it in an ammonia solution.

The amount of the copolymer used is 0.1–10.0 parts, preferably 0.5–4.0 parts, per 1 part of the coupler component based on weight.

As the water-soluble guanidine salt, guanidine carbonate, guanidine acetate, guanidine formate, guanidine phosphate, guanidine sulfamate and guanidine malate can be listed. The amount of the water-soluble guanidine salt used is 0.1–10 parts, preferably 0.2–3.0 parts, per 1 part of the coupler component based on weight.

In the present invention, the thermal melting resin having a melting point 80° C.–150° C. can be preferably added in order to promote thermal coloring characteristics.

Examples of such a thermal melting material include, for example, alcohol derivatives such as 2-tribromomethanol, 2,2-dimethyltrimethyleneglycol and 1,2-cyclohexanediol, waxes such as paraffin wax, microcrystalline wax, montanoic acid wax, carnauba wax, higher fatty acid esters such as monostealine, tristearine, higher alcohols such as polyethyleneglycol, polyethyleneoxide, behenyl alcohol, higher polyhydric alcohol and higher ketone.

An organic acid amido derivative having a general formula (I) can effectively promote the coupling and the coloring reaction since it assists the dissolving when melting. Since this compound is insoluble in water and is not a basic material, it does not inhibit a precoupling preventing function of the copolymer resin during the preservation, Thus, this compound is most preferred.

$$R_1CONHR_2 \quad \text{(I)}$$

(In the general formula (I), $R_1$ is an alkyl or an aryl group having 8–22 carbon atoms, $R_2$ is a hydrogen atom or an alkyl or an aryl group having 1–18 carbon atoms.)

Examples of the organic amido having the general formula (I) include amido dodecylate, amido stearate, amido behenate, methyloamido stearate, dodecylamido-2-naphthoate, anilid myristate and anilid stearate.

In the present invention, the undesirable coloring can be prevented during the preservation. Further, in order to prevent undesirable coloring due to the pressure applied to the exposed surface by rubbing, the intermediate layer can be provided between the photosensitive layer and the coupler layer. The intermediate layer has a copolymer resin having carboxylic acid or dicarboxylate anhydride and/or a thermal melting material having a melting point ranging from about 60° C. to about 150° C. As the copolymer resin having the carboxylic acid or dicarboxylate anhydride and thermal melting material, the above mentioned material can be used. By the intermediate layer having the above-mentioned structure, the thermal developing characteristics are prevented from being deteriorated and the undesirable coloring by the pressure can be avoided.

As a coupling element, those used in a conventional 2-component type diazo copying material can be used. These coupling elements include resorcin, phloroglucin, 2,5-dimethyl-4-morpholinomethylphenol, 3-hydroxycyanoacetanilide, p-sulfoacetanilide, 1-benzoylamino-8-hydroxynaphthalene-3,6-disulfonamide, 2,2-dihydroxynaphthalene, 2,7-dihydroxynaphthalene-3,6-disulfonate sodium, 2,3-dihydroxynaphthalene-6-sulfonic acid, 2,5-dihydroxynaphthalene-sulfonate sodium, 1-hydroxynaphthalene-4-sulfonate sodium, 1-amino-3-hydroxynaphthalene-3,6-disulfonamide, naphthol AS, naphthol AS-D, 2-hydroxynaphthalene-3-biguanide, 2-hydroxy-3-naphthoicmorpholinopropylamide, 2-hydroxy-3-naphthoicethanolamide, 2-hydroxy-3-naphthoic-N,N-dimethylaminopropylamide, 2,4,2',4'-tetrahydroxydiphenyl, and 2,4,2',4'-tetrahydroxydiphenylsulfoxide.

In the present invention, any coupler listed above can be used. However, in view of the preservation characteristics, a water-insoluble or slightly soluble coupler is preferred. As this type of the coupler, for example, naphthol AS or naphthol AS-D can be listed. When this type of coupler is mixed with a thermal melting material, for example, an organic acid amido derivative, eutectic phenomena is observed by measuring DSC. That is, since these materials hane high mutual solubility, the preservation characteristics can be much improved.

The amount of the coupling component used is 0.1–15.0 parts, preferably 0.8–8.0 parts, per 1 part weight of diazo compound based on weight. If the amount of the coupling component is less than 0.1 parts, the color appearing is not strong enough. If the amount is in excess of 15 parts, the undesirable coloring may occur.

The amount of thermal melting material is 0.1–10.0 parts, preferably 0.5–5.0 parts per 1 part of coupling component based on weight. If the amount of the thermal melting material is less than 0.1 parts, the color appearing is not strong enough. If the amount is in excess of 10 parts, a touch thereof is undesirable.

The diazo compound used in the present invention is a diazonium salt having a general formula $ArN_2^+X^-$, in which Ar is a substituted or an unsubstituted aromatic group, $ArN_2^+$ is diazonium salt and $X^-$ is acidic anion. Examples of the diazo compound include 4-diazo-N,N-dimethylaniline, 4-diazophenylmorpholine, 4-diazo-N,N-dibutylaniline, 4-diazo-2,5-dimethoxyphenylmorpholine, 4-diazo-2,5-diethoxyphenylmorpholine, 4-diazo-2,5-dipropoxyphenylmorpholine, 4-diazo-2,5-dibutoxyphenylmorpholine, 4-diazo-2,5-dibutoxy-N-benzyl-N-ethylaniline, 4-diazo-2,5-dibutoxy-N,N-dibutylaniline, 4-diazo-2,5-dibutoxy-N-benzyl-N-oxyethylaniline, 4-diazo-2,5-dibutoxyphenylpiperazine, 4-diazo-2,5-diethoxyphenylpyrrolidine, 4-diazo-2,5-dipropoxyphenylpiperidine, 4-diazo-2,5-diethoxy-N,N-dimethylaniline, 4-diazo-1-benzoylamino-2,5-dibutoxybenzene, 4-diazo-1-(4'-methoxybenzoylamino)-2,5-dimethoxybenzene, 4-diazo-1-(4'-methoxybenzoylamino)-2,5-diethoxybenzene, 4-diazo-1-(4'-methyldibenzoylamino)-2,5-dipropoxybenzene, 4-diazo-1-(3'-chlorobenzoylamino)-2,5-illumination intensitydiethoxybenzene, 4-diazo-1-(3'-methoxybenzoylamino)-2,5-dibutoxybenzene, 4-diazo-1-(3'-methyldibenzoylamino)-2,5-dimethoxybenzene, 4-diazo-1-phenylmercapto-2,5-dipropoxybenzene, 4-diazo-1-(4'-toluicmercapto)-2,5-diethoxybenzene, 4-diazo-1-(4'-methoxyphenylmercapto)-2,5-dibutoxybenzene, 4-diazo-1-(4'-chlorophenylmercapto)-2,5-dimethoxybenzene, 4-diazo-1-(3'-toluicmercapto)-2,5-diethoxybenzene, 4-diazo-1-(3'-methoxyphenylcapto)-2,5-dipropoxybenzene, 4-diazo-1-(2'-toluicmercapto)-2,5-dibutoxybenzene, 4-diazo-1-phenoxy-2,5-dibutoxybenzene and 4-diazo-1-(4'-methoxyphenoxy)-2,5-diethoxybenzene.

The diazo compound may be preferably prepared in a double salt consisting of one of the above compounds and chloride such as zinc chloride, cadmium chloride, tin chloride. Also, the diazo compound may be preferably prepared in a salt consisting of one of the above compounds and an inorganic acid such as sulfuric acid, hexafluorophosphoric acid or tetrafluoroboric acid.

The diazo copying material of the present invention has the support such as a paper or a plastic film, the photosensitive layer containing the diazo compound and the coupler layer. The order of the lamination is not restricted. When the above liquid is applied to the support as an aqueous solution or a diffusion, it may contain bond material. Examples of the bond material include water-soluble resin such as poly (vinyl alcohol), poly (acrylamide), casein, gelatin, starch and derivatives thereof, poly (vinyl pyrrolidone), carboxymethyl cellulose, methyl cellulose, ethyl cellulose, hydroxyethyl cellulose and emulsion resin such as poly (vinyl acetate), poly (acrylate ester), vinyl chloride-acrylate ester copolymer and ethylene-vinyl acetate copolymer.

In the present invention, a precoat layer may be provided between the support and the photosensitive thermal layer in order to improve the image concentration and photosensitivity. Such precoating material includes particle powder and a bonding agent.

As the particle powder used in the precoat layer, an inorganic particle powder or an organic particle powder can be used. Examples of the inorganic particle power include silica, alumina, kaolin, talc, titanium, calcium carbonate, aluminum hydroxide, magnesium hydroxide. Examples the organic particle used in the present invention include styrene resin particle, urea-formaldehyde coupling resin particle, benzoguanamin resin particle.

Examples of the bonding agent include water-soluble resin such as poly (vinyl alcohol), poly (acrylamide), casein, gelatin, starch and derivatives thereof, poly (vinyl pyrrolidone), carboxymethyl cellulose, methyl cellulose, ethyl cellulose, hydroxyethyl cellulose and emulsion resin such as poly (vinyl acetate), poly (acrylate ester), vinyl chloride-acrylate ester copolymer, and ethylene-vinyl acetate copolymer The thermal developing type diazo copying material may include other additives used in the conventional diazo thermal recording material. Such additives include, for example, a stabilizer such as naphthalene-sodium monosulfonate, naphthalene-sodium disulfonate, naphthalene-sodium trisulfonate, sulfosalicylic acid, cadmium sulfate, magnesium sulfate, cadmium chloride and zinc chloride.

As additives, antioxidants such as thiourea and urea, dissolving agents such as caffeine and theophylline, and acid stabilizers such as citric acid, tartanic acid, sulfuric acid, oxalic acid, boric acid, phosphoric acid and pyrophosphoric acid. Besides those, a small amount of saponin may be added.

When the present invention is used as a photofixing type thermal recording material, a lubricating agent may be added in order to prevent a sticking to a thermal head and to improve running characteristics in the printing device. Examples of such a luburicating agent include organic or inorganic particle powder such as styrene resin particle, urea-formalin coupling resin particle, aluminum hydroxide, magnesium hydroxide, titanium, talc, silica, alumina. For the same purpose, a metallic soap may be used.

The thermal developing type diazo copying material is used in a thermal recording area, particularly for recording paper for facsimile machines and computers. Particularly, characters and images are formed by heating and are fixed by decomposition of the unreacted diazo compound due to exposure. Therefore, the coloring operation is easy. The thermal recording material can be utilized in producing securities, merchandise bonds, tickets, certificates, notes and so on due to its high fixing quality.

Other objects and further features of the present invention will be apparent from the following detailed description.

DESCRIPTION OF THE PREFERRED EXAMPLES

The preferred examples of the present invention will now be described in further detail.

Thermal developing type diazo copying materials of the present invention were prepared as follows.

EXAMPLE 1

A coupler diffusion liquid having the following composition was prepared. The prepared coupler diffusion liquid was applied to a free sheet using a wire-bar at 4.5 $g/m^2$ and the applied diffusion liquid was dried to form a coupler layer.

| | |
|---|---|
| Naphthol AS dispersion liquid (20%) | 15 g |
| Styrene-Ammonium acrylate copolymer aqueous solution (20%) (Johnson Polymer Inc., Johncryl 682, Tg 57° C.) | 30 g |
| Amide stearate dispersion liquid (20%) | 30 g |
| Silica powder | 1 g |
| Poly (vinyl alcohol) aqueous solution (10%) | 10 g |
| Guanidine carbonate | 1.5 g |
| Water add to | 100 g |

A photosensitive layer liquid having the following composition was prepared. The prepared. photosensitive layer liquid was applied to the coupler layer using a wire-bar at 0.25 $g/m^2$ and the applied photosensitive layer liquid was dried to form a photosensitive layer.

| | |
|---|---|
| 4-diazo-1-morpholino-2,5-dibutoxybenzene Chloride.½ zinc chloride | 1.5 g |
| Tartaric acid | 1 g |
| Isopropanol | 5 g |
| Saponin | 0.1 g |
| Water | 92.9 g |

EXAMPLE 2

The same procedure as that in EXAMPLE 1 was conducted except that styrene-acrylic acid copolymer (Johncryl 880, Tg 80° C.) was used instead of Johncryl 682.

EXAMPLE 3

A coupler diffusion liquid having the following composition was prepared. The prepared coupler diffusion liquid was applied to a free sheet using a wire-bar at 4.5 $g/m^2$ and the applied diffusion liquid was dried to form a coupler layer.

| | |
|---|---|
| Naphthol AS dispersion liquid (20%) | 15 g |
| Styrene-ammonium maleic anhydride copolymer aqueous solution (20%) (Kurare Inc., SAM3000) | 30 g |
| Amide behenic acid dispersion liquid (20%) | 30 g |
| Silica powder | 1 g |
| Poly (vinyl alcohol) aqueous solution (10%) | 10 g |
| Guanidine acetate | 1.5 g |
| Water add to | 100 g |

The same photosensitive layer liquid as that prepared in EXAMPLE 1 was prepared. The prepared photosensitive layer liquid was applied to the coupler layer using a wire-bar at 0.30 $g/m^2$ and the applied photosensitive layer liquid was dried to form a photosensitive layer.

EXAMPLE 4

The same photosensitive layer liquid as that prepared in EXAMPLE 1 was applied to a free sheet using a wire-bar at 0.30 $g/m^2$ and the applied photosensitive layer liquid was dried to form a photosensitive layer.

A coupler layer diffusion liquid having the following composition was prepared. The prepared coupler layer diffusion liquid was applied to the photosensitive layer using a wire-bar at 4.5 $g/m^2$ and the applied coupler layer diffusion liquid was dried to form a coupler layer.

| | |
|---|---|
| Naphthol AS dispersion liquid (20%) | 15 g |
| Styrene-Ammonium acrylate copolymer aqueous solution (20%) (Johnson Polymer Inc., Johncryl 679, Tg 85° C.) | 30 g |
| Amide stearate dispersion liquid (20%) | 30 g |
| Silica powder | 1 g |
| Poly (vinyl alcohol) aqueous solution (10%) | 10 g |
| Guanidine malate | 1.5 g |
| Water add to | 100 g |

EXAMPLE 5

A coupler diffusion liquid having the following composition was prepared. The prepared coupler diffusion liquid was applied to a free sheet using a wire-bar at 4.5 $g/m^2$ and the applied diffusion liquid was dried to form a coupler layer.

| | |
|---|---|
| Naphthol AS dispersion liquid (20%) | 15 g |
| Styrene-Ammonium acrylate copolymer aqueous solution (20%) (Johnson Polymer Inc., Johncryl 679) | 30 g |
| Isobutylene-ammonia maleic anhydride | 10 g |
| Amide stearate dispersion liquid (20%) | 30 g |
| Silica powder | 1 g |
| Poly (vinyl alcohol) aqueous solution (10%) | 10 g |
| Guanidine carbonate | 1.5 g |
| Water add to | 100 g |

The same photosensitive layer liquid as that prepared in EXAMPLE 1 was applied to the coupler layer using a wire-bar at 0.25 $g/m^2$ and the applied photosensitive layer liquid was dried to form a photosensitive layer.

EXAMPLE 6

A coupler diffusion liquid having the following composition was prepared. The prepared coupler diffusion liquid was applied to a free sheet using a wire-bar at 3.0 $g/m^2$ and the applied diffusion liquid was dried to form a coupler layer.

| | |
|---|---|
| Naphthol AS dispersion liquid (20%) | 15 g |
| Styrene-Ammonium acrylate copolymer aqueous solution (20%) (Johnson Polymer Inc., Johncryl 679) | 30 g |
| Isobutylene-Ammonium maleic anhydride copolymer aqueous solution (20%) (Kurare Inc., ISOBAN104) | 10 g |
| Amide stearate dispersion liquid (20%) | 30 g |
| Silica powder | 1 g |
| Poly (vinyl alcohol) aqueous solution (10%) | 10 g |
| Guanidine carbonate | 1.5 g |
| Water add to | 100 g |

An intermediate layer dispersion liquid having the following component was prepared. The prepared intermediate dispersion liquid is applied on the coupler layer at 1.5 $g/m^2$ to form an intermediate layer.

| | |
|---|---|
| Styrene-Ammonium acrylate copolymer aqueous solution (20%) (Johnson Polymer Inc., Johncryl 679) | 30 g |
| Amide stearate dispersion liquid (20%) | 30 g |

The same photosensitive layer liquid as that prepared in EXAMPLE 1 was applied to the intermediate layer using a wire-bar at 0.25 $g/m^2$ and the applied photosensitive layer liquid was dried to form a photosensitive layer.

In order to conduct a comparison test, the following COMPARATIVE EXAMPLES are prepared as follows.

COMPARATIVE EXAMPLE 1

A thermal developing type diazo copying material was prepared in the same manner as that in Example 1 except that guanidine carbonate was not used in the coupler layer dispersion liquid.

COMPARATIVE EXAMPLE 2

A thermal developing type diazo copying material was prepared in the same manner as that in Example 1 except that styrene-ammonium acrylate copolymer aqueous solution was not used in the coupler layer dispersion liquid.

COMPARATIVE EXAMPLE 3

A thermal developing type diazo copying material was prepared in the same manner as that in Example 1 except that guanidine carbonate was replaced by potassium carbonate in the coupler layer dispersion liquid.

COMPARATIVE TEST

The prepared thermal developing type diazo copying materials of each EXAMPLE and COMPARATIVE EXAMPLE were overlapped with an original document and exposed and developed in COPYART 100 (Fuji Photo Film Co., Ltd.), and blue images were obtained. Concentrations of the images obtained were measured by a Macbeth Illuminometer 914.

In order to evaluate the preservation characteristics, each sample was forced to undergo deterioration by leaving each sample under a condition of 50° C. and 50% RH for 24 hours. After the whole surface of the samples was exposed, the concentration of the blank zone was measured by the Macbeth Illuminometer 914. The concentration of the blank space, which was not forced to undergo deterioration was measured in the same manner.

Further, the surface of each sample, which was not deteriorated, was rubbed with a round bar. The fog appearing was evaluated visibly.

The results are shown in TABLE 1.

TABLE 1

| | TESTING ITEMS | | | |
|---|---|---|---|---|
| | | PRESERVATION CHARACTERISTICS | | |
| SAMPLE | IMAGE CONCENTRATION | BLANK ZONE CONCENTRATION (BEFORE DETERIORATION) | BLANK ZONE CONCENTRATION (AFTER DETERIORATION) | FOG BY RUBBING[1)] |
| EXAMPLE 1 | 1.17 | 0.09 | 0.18 | Δ |
| EXAMPLE 2 | 1.19 | 0.09 | 0.14 | Δ |
| EXAMPLE 3 | 1.16 | 0.09 | 0.17 | Δ |
| EXAMPLE 4 | 1.18 | 0.09 | 0.13 | Δ |
| EXAMPLE 5 | 1.17 | 0.09 | 0.12 | Δ |
| EXAMPLE 6 | 1.20 | 0.09 | 0.12 | O |
| COMPARATIVE EXAMPLE 1 | 0.55 | 0.09 | 0.13 | Δ |
| COMPARATIVE EXAMPLE 2 | 1.03 | 0.24 | 0.54 | X |
| COMPARATIVE EXAMPLE 3 | 1.01 | 0.17 | 0.43 | X |

[1)]O: NO PROBLEM,
Δ: PRACTICALLY NO PROBLEM
X: NOT PRACTICAL USE

As is seen from the TABLE 1, high coloring concentrations were provided, the undesirable coloring can be avoided and good preservation characteristics were realized according to the present invention.

Further, the present invention is not limited to these examples, but various variations and modifications may be made without departing from the scope of the present invention.

What is claimed is:

1. A thermal developing type diazo copying material comprising:

a support;

a photosensitive layer formed on said support, said photosensitive layer including a diazo compound; and a coupler layer formed on said support, said coupler layer including a coupler component, said coupler layer having a water-soluble quanidine salt and having a copolymer resin including a monomer having a carboxylic acid.

2. A thermal developing type diazo copying material according to claim 1, wherein at least one of said coupler layer and said photosensitive layer includes a thermal melting material having a melting point ranging from 60° C. to 150° C.

3. A thermal developing type diazo copying material according to claim 1 further comprising a intermediate layer provided between said coupler layer and said photosensitive layer, said intermediate layer including a copolymer including a monomer having a carboxylic acid and/or a thermal melting material, said thermal melting material having a melting point ranging from 60° C. to 150° C.

4. A thermal developing type diazo copying material according to claim 1, wherein said copolymer resin is styrene-acrylic acid copolymer.

5. A thermal developing type diazo copying material according to claim 1, wherein said copolymer resin is styrene-acrylic acid copolymer having a Tg more than 60° C.

6. A thermal developing type diazo copying material according to claim 1, wherein said copolymer resin is one of a mixture of styrene-acrylic acid copolymer and isobutylene-maleic anhydride and a mixture of styrene-acrylic acid copolymer and styrene-maleic anhydride copolymer.

* * * * *